(12) United States Patent
Lee et al.

(10) Patent No.: US 7,622,377 B2
(45) Date of Patent: Nov. 24, 2009

(54) MICROFEATURE WORKPIECE SUBSTRATES HAVING THROUGH-SUBSTRATE VIAS, AND ASSOCIATED METHODS OF FORMATION

(75) Inventors: Teck Kheng Lee, Singapore (SG); Andrew Chong Pei Lim, Singapore (SG)

(73) Assignee: Micron Technology, Inc., Boise, ID (US)

( * ) Notice: Subject to any disclaimer, the term of this patent is extended or adjusted under 35 U.S.C. 154(b) by 109 days.

(21) Appl. No.: 11/218,352

(22) Filed: Sep. 1, 2005

(65) Prior Publication Data
US 2007/0045826 A1    Mar. 1, 2007

(51) Int. Cl.
*H01L 21/44* (2006.01)
(52) U.S. Cl. ............................. 438/612; 257/E21.505
(58) Field of Classification Search ................ 438/106, 438/597, 618, 612
See application file for complete search history.

(56) References Cited

U.S. PATENT DOCUMENTS

| | | | |
|---|---|---|---|
| 2,821,959 A | 2/1958 | Franz | |
| 3,006,318 A | 10/1961 | Monroe, Jr. et al. | |
| 3,345,134 A | 10/1967 | Heymer et al. | |
| 3,865,298 A | 2/1975 | Allen et al. | |
| 3,902,036 A | 8/1975 | Zaleckas | |
| 4,040,168 A | 8/1977 | Huang | |
| 4,368,106 A | 1/1983 | Anthony | |
| 4,534,100 A | 8/1985 | Lane | |
| 4,581,301 A | 4/1986 | Michaelson | |
| 4,608,480 A | 8/1986 | Bizot et al. | |
| 4,614,427 A | 9/1986 | Koizumi et al. | |
| 4,627,971 A | 12/1986 | Ayer | |
| 4,660,063 A | 4/1987 | Anthony | |
| 4,756,765 A | 7/1988 | Woodroffe | |
| 4,768,291 A | 9/1988 | Palmer | |

(Continued)

FOREIGN PATENT DOCUMENTS

EP    0127946    12/1984

(Continued)

OTHER PUBLICATIONS

U.S. Appl. No. 11/966,824, filed Dec. 28, 2007, Pratt et al.

(Continued)

*Primary Examiner*—Thao X Le
*Assistant Examiner*—Elias Ullah
(74) *Attorney, Agent, or Firm*—Perkins Coie LLP

(57) ABSTRACT

Microfeature workpiece substrates having through-substrate vias, and associated methods of formation are disclosed. A method in accordance with one embodiment for forming a support substrate for carrying microfeature dies includes exposing a support substrate to an electrolyte, with the support substrate having a first side with a first conductive layer, a second side opposite the first side with a second conductive layer, and a conductive path extending through the support substrate from the first conductive layer to the second conductive layer. The method can further include forming a bond pad at a bond site of the first conductive layer by disposing at least one conductive bond pad material at the bond site, wherein disposing the at least one conductive bond pad material can include passing an electrical current between the first and second conductive layers via the conductive path, while the substrate is exposed to the electrolyte.

34 Claims, 5 Drawing Sheets

U.S. PATENT DOCUMENTS

| | | |
|---|---|---|
| 4,906,314 A | 3/1990 | Farnworth et al. |
| 4,959,705 A | 9/1990 | Lemnios et al. |
| 4,964,212 A | 10/1990 | Deroux-Dauphin et al. |
| 4,984,597 A | 1/1991 | McConnell et al. |
| 5,024,966 A | 6/1991 | Dietrich et al. |
| 5,026,964 A | 6/1991 | Somers et al. |
| 5,027,184 A | 6/1991 | Soclof |
| 5,037,782 A | 8/1991 | Nakamura et al. |
| 5,123,902 A | 6/1992 | Muller et al. |
| 5,128,831 A | 7/1992 | Fox, III et al. |
| 5,130,783 A | 7/1992 | McLellan |
| 5,145,099 A | 9/1992 | Wood et al. |
| 5,158,911 A | 10/1992 | Quentin et al. |
| 5,219,344 A | 6/1993 | Yoder, Jr. |
| 5,233,448 A | 8/1993 | Wu et al. |
| 5,237,148 A | 8/1993 | Aoki et al. |
| 5,289,631 A | 3/1994 | Koopman et al. |
| 5,292,686 A | 3/1994 | Riley et al. |
| 5,294,568 A | 3/1994 | McNeilly et al. |
| 5,371,397 A | 12/1994 | Maegawa et al. |
| 5,378,312 A | 1/1995 | Gifford et al. |
| 5,380,681 A | 1/1995 | Hsu et al. |
| 5,402,435 A | 3/1995 | Shiono et al. |
| 5,406,630 A | 4/1995 | Piosenka et al. |
| 5,424,573 A | 6/1995 | Kato et al. |
| 5,435,887 A | 7/1995 | Rothschild et al. |
| 5,438,212 A | 8/1995 | Okaniwa et al. |
| 5,447,871 A | 9/1995 | Goldstein |
| 5,464,960 A | 11/1995 | Hall et al. |
| 5,496,755 A | 3/1996 | Bayraktaroglu |
| 5,505,804 A | 4/1996 | Mizuguchi et al. |
| 5,515,167 A | 5/1996 | Ledger et al. |
| 5,518,956 A | 5/1996 | Liu et al. |
| 5,585,308 A | 12/1996 | Sardella |
| 5,585,675 A | 12/1996 | Knopf |
| 5,593,913 A | 1/1997 | Aoki et al. |
| 5,593,927 A | 1/1997 | Farnworth et al. |
| 5,605,783 A | 2/1997 | Revelli et al. |
| 5,614,743 A | 3/1997 | Mochizuki et al. |
| 5,624,437 A | 4/1997 | Freeman et al. |
| 5,627,106 A | 5/1997 | Hsu et al. |
| 5,646,067 A | 7/1997 | Gaul |
| 5,654,221 A | 8/1997 | Cronin et al. |
| 5,672,519 A | 9/1997 | Song et al. |
| 5,673,846 A | 10/1997 | Gruber |
| 5,677,566 A | 10/1997 | King et al. |
| 5,684,642 A | 11/1997 | Zumoto et al. |
| 5,690,841 A | 11/1997 | Elderstig et al. |
| 5,694,246 A | 12/1997 | Aoyama et al. |
| 5,708,293 A | 1/1998 | Ochi et al. |
| 5,718,791 A | 2/1998 | Spengler et al. |
| 5,723,904 A | 3/1998 | Shiga et al. |
| 5,726,493 A | 3/1998 | Yamashita et al. |
| 5,771,158 A | 6/1998 | Yamagishi et al. |
| 5,773,359 A | 6/1998 | Mitchell et al. |
| 5,776,824 A | 7/1998 | Farnworth et al. |
| 5,807,439 A | 9/1998 | Akatsu et al. |
| 5,811,799 A | 9/1998 | Wu |
| 5,821,532 A | 10/1998 | Beaman et al. |
| 5,825,080 A | 10/1998 | Imaoka et al. |
| 5,826,628 A | 10/1998 | Hamilton |
| 5,847,454 A | 12/1998 | Shaw et al. |
| 5,851,845 A | 12/1998 | Wood et al. |
| 5,857,963 A | 1/1999 | Pelchy et al. |
| 5,861,654 A | 1/1999 | Johnson |
| 5,870,289 A | 2/1999 | Tokuda et al. |
| 5,870,823 A | 2/1999 | Bezama et al. |
| 5,877,040 A | 3/1999 | Park et al. |
| 5,891,797 A | 4/1999 | Farrar |
| 5,893,828 A | 4/1999 | Uram |
| 5,897,338 A | 4/1999 | Kaldenberg |
| 5,904,499 A | 5/1999 | Pace |
| 5,914,488 A | 6/1999 | Sone |
| 5,933,713 A | 8/1999 | Farnworth |
| 5,946,553 A | 8/1999 | Wood et al. |
| 5,977,535 A | 11/1999 | Rostoker |
| 5,986,209 A | 11/1999 | Tandy |
| 5,990,566 A | 11/1999 | Farnworth et al. |
| RE36,469 E | 12/1999 | Wood et al. |
| 5,998,240 A | 12/1999 | Hamilton et al. |
| 5,998,292 A | 12/1999 | Black et al. |
| 5,998,862 A | 12/1999 | Yamanaka et al. |
| 6,004,867 A | 12/1999 | Kim et al. |
| 6,008,070 A | 12/1999 | Farnworth |
| 6,008,914 A | 12/1999 | Sasagawa et al. |
| 6,018,249 A | 1/2000 | Akram et al. |
| 6,020,624 A | 2/2000 | Wood et al. |
| 6,072,233 A | 6/2000 | Corisis et al. |
| 6,072,236 A | 6/2000 | Akram et al. |
| 6,080,291 A | 6/2000 | Woodruff et al. |
| 6,089,920 A | 7/2000 | Farnworth et al. |
| 6,097,087 A | 8/2000 | Farnworth et al. |
| 6,103,547 A | 8/2000 | Corisis et al. |
| 6,104,086 A | 8/2000 | Ichikawa et al. |
| 6,107,122 A | 8/2000 | Wood et al. |
| 6,107,180 A | 8/2000 | Munroe et al. |
| 6,107,679 A | 8/2000 | Noguchi et al. |
| 6,110,825 A | 8/2000 | Mastromatteo et al. |
| 6,114,240 A | 9/2000 | Akram et al. |
| 6,119,335 A | 9/2000 | Park et al. |
| 6,124,634 A | 9/2000 | Akram et al. |
| 6,130,141 A | 10/2000 | Degani et al. |
| 6,130,474 A | 10/2000 | Corisis |
| 6,133,622 A | 10/2000 | Corisis et al. |
| 6,137,182 A | 10/2000 | Hause et al. |
| 6,140,604 A | 10/2000 | Somers et al. |
| 6,143,588 A | 11/2000 | Glenn |
| 6,148,509 A | 11/2000 | Schoenfeld et al. |
| 6,150,710 A | 11/2000 | Corisis |
| 6,150,717 A | 11/2000 | Wood et al. |
| 6,153,924 A | 11/2000 | Kinsman |
| 6,159,764 A | 12/2000 | Kinsman et al. |
| 6,180,518 B1 | 1/2001 | Layadi et al. |
| 6,184,465 B1 | 2/2001 | Corisis |
| 6,187,615 B1 | 2/2001 | Kim et al. |
| 6,188,232 B1 | 2/2001 | Akram et al. |
| 6,191,487 B1 | 2/2001 | Rodenbeck et al. |
| 6,201,304 B1 | 3/2001 | Moden |
| 6,203,539 B1 | 3/2001 | Shimmick et al. |
| 6,214,716 B1 | 4/2001 | Akram |
| 6,222,136 B1 | 4/2001 | Appelt et al. |
| 6,222,270 B1 | 4/2001 | Lee et al. |
| 6,225,689 B1 | 5/2001 | Moden et al. |
| 6,228,548 B1 | 5/2001 | King et al. |
| 6,228,687 B1 | 5/2001 | Akram et al. |
| 6,229,202 B1 | 5/2001 | Corisis |
| 6,232,666 B1 | 5/2001 | Corisis et al. |
| 6,235,552 B1 | 5/2001 | Kwon et al. |
| 6,236,046 B1 | 5/2001 | Watabe et al. |
| 6,239,489 B1 | 5/2001 | Jiang |
| 6,246,108 B1 | 6/2001 | Corisis et al. |
| 6,247,629 B1 | 6/2001 | Jacobson et al. |
| 6,252,300 B1 | 6/2001 | Hsuan et al. |
| 6,258,623 B1 | 7/2001 | Moden et al. |
| 6,259,083 B1 | 7/2001 | Kimura et al. |
| 6,265,766 B1 | 7/2001 | Moden |
| 6,266,197 B1 | 7/2001 | Glenn et al. |
| 6,268,114 B1 | 7/2001 | Wen et al. |
| 6,271,580 B1 | 8/2001 | Corisis |
| 6,274,927 B1 | 8/2001 | Glenn |
| 6,277,757 B1 | 8/2001 | Lin |
| 6,281,042 B1 | 8/2001 | Ahn et al. |
| 6,285,064 B1 | 9/2001 | Foster |
| 6,285,204 B1 | 9/2001 | Farnworth |

| | | |
|---|---|---|
| 6,291,894 B1 | 9/2001 | Farnworth et al. |
| 6,294,837 B1 | 9/2001 | Akram et al. |
| 6,324,253 B1 | 11/2001 | Yuyama et al. |
| 6,326,689 B1 | 12/2001 | Thomas |
| 6,326,697 B1 | 12/2001 | Farnworth |
| 6,326,698 B1 | 12/2001 | Akram |
| 6,329,222 B1 | 12/2001 | Corisis et al. |
| 6,329,632 B1 | 12/2001 | Fournier et al. |
| 6,331,221 B1 | 12/2001 | Cobbley |
| 6,341,009 B1 | 1/2002 | O'Connor et al. |
| 6,344,976 B1 | 2/2002 | Schoenfeld et al. |
| 6,351,027 B1 | 2/2002 | Giboney et al. |
| 6,359,254 B1 | 3/2002 | Brown |
| 6,359,328 B1 | 3/2002 | Dubin |
| 6,372,548 B2 | 4/2002 | Bessho et al. |
| 6,391,770 B2 | 5/2002 | Kosaki et al. |
| 6,406,636 B1 | 6/2002 | Vaganov |
| 6,407,381 B1 | 6/2002 | Glenn et al. |
| 6,411,439 B2 | 6/2002 | Nishikawa et al. |
| 6,433,303 B1 | 8/2002 | Liu et al. |
| 6,437,284 B1 | 8/2002 | Okamoto et al. |
| 6,437,441 B1 | 8/2002 | Yamamoto et al. |
| 6,437,586 B1 | 8/2002 | Robinson |
| 6,441,487 B2 | 8/2002 | Elenius et al. |
| 6,452,270 B1 | 9/2002 | Huang et al. |
| 6,457,515 B1 | 10/2002 | Vafai et al. |
| 6,459,039 B1 | 10/2002 | Bezama et al. |
| 6,468,889 B1 | 10/2002 | Iacoponi et al. |
| 6,483,044 B1 | 11/2002 | Ahmad |
| 6,483,652 B2 | 11/2002 | Nakamura et al. |
| 6,486,083 B1 | 11/2002 | Mizuno et al. |
| 6,486,549 B1 | 11/2002 | Chiang et al. |
| 6,503,780 B1 | 1/2003 | Glenn et al. |
| 6,521,516 B2 | 2/2003 | Monzon et al. |
| 6,521,530 B2 | 2/2003 | Peters et al. |
| 6,534,192 B1 | 3/2003 | Abys et al. |
| 6,534,863 B2 | 3/2003 | Walker et al. |
| 6,541,762 B2 | 4/2003 | Kang et al. |
| 6,545,563 B1 | 4/2003 | Smith |
| 6,555,782 B2 | 4/2003 | Isaji et al. |
| 6,560,047 B2 | 5/2003 | Choi et al. |
| 6,566,745 B1 | 5/2003 | Beyne et al. |
| 6,569,711 B1 | 5/2003 | Susko et al. |
| 6,569,777 B1 | 5/2003 | Hsu et al. |
| 6,572,606 B2 | 6/2003 | Kliewer et al. |
| 6,576,531 B2 | 6/2003 | Peng et al. |
| 6,580,174 B2 | 6/2003 | McCormick et al. |
| 6,582,987 B2 | 6/2003 | Jun et al. |
| 6,593,644 B2 | 7/2003 | Chiu et al. |
| 6,599,436 B1 | 7/2003 | Matzke et al. |
| 6,603,183 B1 | 8/2003 | Hoffman |
| 6,606,251 B1 | 8/2003 | Kenny, Jr. et al. |
| 6,614,033 B2 | 9/2003 | Suguro et al. |
| 6,614,092 B2 | 9/2003 | Eldridge et al. |
| 6,617,623 B2 | 9/2003 | Rhodes |
| 6,620,031 B2 | 9/2003 | Renteln |
| 6,620,731 B1 | 9/2003 | Farnworth et al. |
| 6,621,045 B1 | 9/2003 | Liu et al. |
| 6,638,410 B2 | 10/2003 | Chen et al. |
| 6,653,236 B2 | 11/2003 | Wai et al. |
| 6,658,818 B2 | 12/2003 | Kurth et al. |
| 6,660,622 B2 | 12/2003 | Chen et al. |
| 6,660,630 B1 | 12/2003 | Chang et al. |
| 6,661,047 B2 | 12/2003 | Rhodes |
| 6,664,485 B2 | 12/2003 | Bhatt et al. |
| 6,667,551 B2 | 12/2003 | Hanaoka et al. |
| 6,670,986 B1 | 12/2003 | Shoshan et al. |
| 6,680,459 B2 | 1/2004 | Kanaya et al. |
| 6,686,588 B1 | 2/2004 | Webster et al. |
| 6,699,787 B2 | 3/2004 | Mashino et al. |
| 6,703,310 B2 | 3/2004 | Mashino et al. |
| 6,708,405 B2 | 3/2004 | Hasler et al. |
| 6,734,419 B1 | 5/2004 | Glenn et al. |
| 6,746,971 B1 | 6/2004 | Ngo et al. |
| 6,756,564 B2 | 6/2004 | Tian |
| 6,759,266 B1 | 7/2004 | Hoffman |
| 6,770,958 B2 | 8/2004 | Wang et al. |
| 6,774,486 B2 | 8/2004 | Kinsman |
| 6,777,244 B2 | 8/2004 | Pepper et al. |
| 6,778,046 B2 | 8/2004 | Stafford et al. |
| 6,780,749 B2 | 8/2004 | Masumoto et al. |
| 6,790,775 B2 | 9/2004 | Fartash |
| 6,791,076 B2 | 9/2004 | Webster |
| 6,795,120 B2 | 9/2004 | Takagi et al. |
| 6,797,616 B2 | 9/2004 | Kinsman |
| 6,800,943 B2 | 10/2004 | Adachi |
| 6,809,025 B2 | 10/2004 | Sandhu et al. |
| 6,809,421 B1 | 10/2004 | Hayasaka et al. |
| 6,813,154 B2 | 11/2004 | Diaz et al. |
| 6,818,464 B2 | 11/2004 | Heschel et al. |
| 6,825,127 B2 | 11/2004 | Ouellet et al. |
| 6,825,458 B1 | 11/2004 | Moess et al. |
| 6,825,557 B2 | 11/2004 | DiBattista et al. |
| 6,828,175 B2 | 12/2004 | Wood et al. |
| 6,828,223 B2 | 12/2004 | Chuang |
| 6,828,663 B2 | 12/2004 | Chen et al. |
| 6,828,674 B2 | 12/2004 | Karpman |
| 6,838,377 B2 | 1/2005 | Tonami et al. |
| 6,844,978 B2 | 1/2005 | Harden et al. |
| 6,852,621 B2 | 2/2005 | Hanaoka et al. |
| 6,856,023 B2 | 2/2005 | Muta et al. |
| 6,858,891 B2 | 2/2005 | Farnworth et al. |
| 6,864,172 B2 | 3/2005 | Noma et al. |
| 6,864,457 B1 | 3/2005 | Alexander et al. |
| 6,867,390 B2 | 3/2005 | Clauer et al. |
| 6,873,054 B2 | 3/2005 | Miyazawa et al. |
| 6,882,021 B2 | 4/2005 | Boon et al. |
| 6,885,107 B2 | 4/2005 | Kinsman |
| 6,903,012 B2 | 6/2005 | Geefay et al. |
| 6,903,442 B2 | 6/2005 | Wood et al. |
| 6,910,268 B2 | 6/2005 | Miller |
| 6,913,952 B2 * | 7/2005 | Moxham et al. ............. 438/125 |
| 6,916,725 B2 | 7/2005 | Yamaguchi et al. |
| 6,934,065 B2 | 8/2005 | Kinsman |
| 6,936,536 B2 | 8/2005 | Sinha |
| 6,943,056 B2 | 9/2005 | Nemoto et al. |
| 6,946,325 B2 | 9/2005 | Yean et al. |
| 6,951,627 B2 | 10/2005 | Li et al. |
| 6,953,748 B2 | 10/2005 | Yamaguchi et al. |
| 6,970,775 B2 | 11/2005 | Lederle et al. |
| 6,982,487 B2 | 1/2006 | Kim et al. |
| 7,022,609 B2 | 4/2006 | Yamamoto et al. |
| 7,023,090 B2 | 4/2006 | Huang et al. |
| 7,029,937 B2 | 4/2006 | Miyazawa et al. |
| 7,033,927 B2 | 4/2006 | Cohen et al. |
| 7,041,598 B2 | 5/2006 | Sharma |
| 7,045,015 B2 | 5/2006 | Renn et al. |
| 7,083,425 B2 | 8/2006 | Chong et al. |
| 7,084,073 B2 | 8/2006 | Lee et al. |
| 7,091,124 B2 | 8/2006 | Rigg et al. |
| 7,092,284 B2 | 8/2006 | Braun et al. |
| 7,094,677 B2 | 8/2006 | Yamamoto et al. |
| 7,109,068 B2 | 9/2006 | Akram et al. |
| 7,151,009 B2 | 12/2006 | Kim et al. |
| 7,164,565 B2 | 1/2007 | Takeda |
| 7,166,247 B2 | 1/2007 | Kramer |
| 7,170,183 B1 | 1/2007 | Kim et al. |
| 7,183,176 B2 | 2/2007 | Sankarapillai et al. |
| 7,183,653 B2 | 2/2007 | Myers et al. |
| 7,186,650 B1 | 3/2007 | Dakshina-Murthy |
| 7,190,061 B2 | 3/2007 | Lee et al |
| 7,199,050 B2 | 4/2007 | Hiatt |
| 7,217,596 B2 | 5/2007 | Cobbley et al. |
| 7,217,888 B2 | 5/2007 | Sunohara et al. |
| 7,232,754 B2 | 6/2007 | Kirby et al. |
| 7,256,073 B2 | 8/2007 | Noma et al. |

| | | | | | | |
|---|---|---|---|---|---|---|
| 7,262,134 | B2 | 8/2007 | Kirby et al. | 2005/0184219 A1 | 8/2005 | Kirby |
| 7,262,495 | B2 | 8/2007 | Chen et al. | 2005/0191861 A1 | 9/2005 | Verhaverbeke |
| 7,265,052 | B2 | 9/2007 | Sinha | 2005/0194169 A1 | 9/2005 | Tonomura |
| 7,317,256 | B2 | 1/2008 | Williams et al. | 2005/0208766 A1 | 9/2005 | Kirby et al. |
| 2001/0020739 | A1 | 9/2001 | Honda | 2005/0236708 A1 | 10/2005 | Farnworth et al. |
| 2002/0005583 | A1 | 1/2002 | Harada et al. | 2005/0247894 A1 | 11/2005 | Watkins et al. |
| 2002/0006687 | A1 | 1/2002 | Lam | 2005/0253213 A1 | 11/2005 | Jiang et al. |
| 2002/0020898 | A1 | 2/2002 | Vu et al. | 2005/0254133 A1 | 11/2005 | Akram et al. |
| 2002/0027293 | A1 | 3/2002 | Hoshino | 2005/0258530 A1 | 11/2005 | Vindasius et al. |
| 2002/0057468 | A1 | 5/2002 | Segawa et al. | 2005/0272221 A1 | 12/2005 | Yen et al. |
| 2002/0059722 | A1 | 5/2002 | Murakami | 2005/0275048 A1 | 12/2005 | Farnworth et al. |
| 2002/0060208 | A1 | 5/2002 | Liu et al. | 2005/0275049 A1 | 12/2005 | Kirby et al. |
| 2002/0089025 | A1 | 7/2002 | Chou | 2005/0275051 A1 | 12/2005 | Farnworth et al. |
| 2002/0094607 | A1 | 7/2002 | Gebauer et al. | 2005/0275750 A1 | 12/2005 | Akram et al. |
| 2002/0096729 | A1 | 7/2002 | Tu et al. | 2005/0277293 A1 | 12/2005 | Kim et al. |
| 2002/0113296 | A1 | 8/2002 | Cho et al. | 2005/0282374 A1 | 12/2005 | Hwang et al. |
| 2002/0130390 | A1 | 9/2002 | Ker et al. | 2005/0285154 A1 | 12/2005 | Akram et al. |
| 2002/0145676 | A1 | 10/2002 | Kuno et al. | 2006/0003566 A1 | 1/2006 | Emesh |
| 2002/0190371 | A1 | 12/2002 | Mashino et al. | 2006/0011809 A1 | 1/2006 | Farnworth et al. |
| 2003/0014895 | A1 | 1/2003 | Lizotte | 2006/0014313 A1 | 1/2006 | Hall et al. |
| 2003/0042564 | A1 | 3/2003 | Taniguchi et al. | 2006/0023107 A1 | 2/2006 | Bolken et al. |
| 2003/0062601 | A1 | 4/2003 | Harnden et al. | 2006/0024856 A1 | 2/2006 | Derderian et al. |
| 2003/0119308 | A1 | 6/2003 | Geefay et al. | 2006/0035402 A1 | 2/2006 | Street et al. |
| 2003/0148597 | A1 | 8/2003 | Tan et al. | 2006/0035415 A1 | 2/2006 | Wood et al. |
| 2003/0216023 | A1 | 11/2003 | Wark et al. | 2006/0038183 A1 | 2/2006 | Oliver |
| 2004/0004280 | A1 | 1/2004 | Shibata | 2006/0038272 A1 | 2/2006 | Edwards |
| 2004/0012698 | A1 | 1/2004 | Suda et al. | 2006/0040421 A1 | 2/2006 | Farnworth et al. |
| 2004/0018712 | A1 | 1/2004 | Plas et al. | 2006/0040428 A1 | 2/2006 | Johnson |
| 2004/0023447 | A1 | 2/2004 | Hirakata et al. | 2006/0042952 A1 | 3/2006 | Oliver et al. |
| 2004/0023469 | A1 | 2/2004 | Suda | 2006/0043262 A1 | 3/2006 | Akram |
| 2004/0038442 | A1 | 2/2004 | Kinsman | 2006/0043509 A1 | 3/2006 | Watkins et al. |
| 2004/0041261 | A1 | 3/2004 | Kinsman | 2006/0043512 A1 | 3/2006 | Oliver et al. |
| 2004/0043607 | A1 | 3/2004 | Farnworth et al. | 2006/0043569 A1 | 3/2006 | Benson et al. |
| 2004/0046251 | A1 | 3/2004 | Lee | 2006/0043599 A1 | 3/2006 | Akram et al. |
| 2004/0073607 | A1 | 4/2004 | Su et al. | 2006/0044433 A1 | 3/2006 | Akram |
| 2004/0082094 | A1 | 4/2004 | Yamamoto | 2006/0046332 A1 | 3/2006 | Derderian et al. |
| 2004/0087441 | A1 | 5/2004 | Bock et al. | 2006/0046438 A1 | 3/2006 | Kirby |
| 2004/0094389 | A1 | 5/2004 | Boyce | 2006/0046468 A1 | 3/2006 | Akram et al. |
| 2004/0137661 | A1 | 7/2004 | Murayama | 2006/0046471 A1 | 3/2006 | Kirby et al. |
| 2004/0137701 | A1 | 7/2004 | Takao | 2006/0046537 A1 | 3/2006 | Chong et al. |
| 2004/0141536 | A1 | 7/2004 | Liu et al. | 2006/0057776 A1 | 3/2006 | Tao |
| 2004/0159668 | A1 | 8/2004 | Vasiadis | 2006/0057836 A1 | 3/2006 | Nagarajan et al. |
| 2004/0159958 | A1 | 8/2004 | Funaki | 2006/0148250 A1 | 7/2006 | Kirby |
| 2004/0178491 | A1 | 9/2004 | Akram et al. | 2006/0151880 A1 | 7/2006 | Tang et al. |
| 2004/0180539 | A1 | 9/2004 | Yamamoto et al. | 2006/0154153 A1 | 7/2006 | Chiang et al. |
| 2004/0192033 | A1 | 9/2004 | Hara | 2006/0160367 A1 | 7/2006 | Wai et al. |
| 2004/0198033 | A1* | 10/2004 | Lee et al. .................. 438/613 | 2006/0177999 A1 | 8/2006 | Hembree et al. |
| 2004/0198040 | A1 | 10/2004 | Geefay et al. | 2006/0180941 A1 | 8/2006 | Kirby et al. |
| 2004/0214373 | A1 | 10/2004 | Jiang et al. | 2006/0186097 A1 | 8/2006 | Watkins et al. |
| 2004/0219342 | A1 | 11/2004 | Boggs et al. | 2006/0191882 A1 | 8/2006 | Watkins et al. |
| 2004/0219763 | A1 | 11/2004 | Kim et al. | 2006/0199363 A1 | 9/2006 | Kirby et al. |
| 2004/0222082 | A1 | 11/2004 | Gopalraja et al. | 2006/0204651 A1 | 9/2006 | Wai et al. |
| 2004/0245649 | A1 | 12/2004 | Imaoka | 2006/0208360 A1 | 9/2006 | Yiu et al. |
| 2004/0255258 | A1 | 12/2004 | Li | 2006/0216862 A1 | 9/2006 | Rigg et al. |
| 2004/0262753 | A1 | 12/2004 | Kashiwazaki | 2006/0223301 A1 | 10/2006 | Vanhaelemeersch et al. |
| 2005/0026443 | A1 | 2/2005 | Goo et al. | 2006/0240687 A1 | 10/2006 | Chong et al. |
| 2005/0037608 | A1 | 2/2005 | Andricacos et al. | 2006/0252254 A1 | 11/2006 | Basol |
| 2005/0046002 | A1 | 3/2005 | Lee et al. | 2006/0252262 A1 | 11/2006 | Kazemi |
| 2005/0052751 | A1 | 3/2005 | Liu et al. | 2006/0255443 A1 | 11/2006 | Hwang et al. |
| 2005/0064707 | A1 | 3/2005 | Sinha | 2006/0264041 A1 | 11/2006 | Rigg et al. |
| 2005/0067620 | A1 | 3/2005 | Chan et al. | 2006/0270108 A1 | 11/2006 | Farnworth et al. |
| 2005/0069782 | A1 | 3/2005 | Elenius et al. | 2006/0278979 A1 | 12/2006 | Rangel |
| 2005/0101116 | A1 | 5/2005 | Tseng | 2006/0278980 A1 | 12/2006 | Trezza et al. |
| 2005/0104228 | A1 | 5/2005 | Rigg et al. | 2006/0278988 A1 | 12/2006 | Trezza et al. |
| 2005/0106834 | A1 | 5/2005 | Andry et al. | 2006/0281224 A1 | 12/2006 | Edelstein et al. |
| 2005/0110095 | A1 | 5/2005 | Shih et al. | 2006/0281243 A1 | 12/2006 | Trezza |
| 2005/0110889 | A1 | 5/2005 | Tuttle et al. | 2006/0289967 A1 | 12/2006 | Heck et al. |
| 2005/0127478 | A1 | 6/2005 | Hiatt et al. | 2006/0289968 A1 | 12/2006 | Sulfridge |
| 2005/0136646 | A1 | 6/2005 | Larnerd et al. | 2006/0290001 A1 | 12/2006 | Sulfridge |
| 2005/0139390 | A1 | 6/2005 | Kim et al. | 2006/0292877 A1 | 12/2006 | Lake |
| 2005/0150683 | A1* | 7/2005 | Farnworth et al. .......... 174/255 | 2007/0004079 A1 | 1/2007 | Geefay et al. |
| 2005/0151228 | A1 | 7/2005 | Tanida et al. | 2007/0012655 A1 | 1/2007 | Kwon et al. |
| 2005/0164500 | A1 | 7/2005 | Lindgren | 2007/0020805 A1 | 1/2007 | Kim et al. |

| | | | |
|---|---|---|---|
| 2007/0020935 A1 | 1/2007 | Taylor et al. |
| 2007/0023121 A1 | 2/2007 | Jones et al. |
| 2007/0032061 A1 | 2/2007 | Farnworth et al. |
| 2007/0035033 A1 | 2/2007 | Ozguz et al. |
| 2007/0037379 A1 | 2/2007 | Enquist et al. |
| 2007/0042598 A1 | 2/2007 | Park |
| 2007/0045120 A1 | 3/2007 | Tiwari et al. |
| 2007/0045388 A1 | 3/2007 | Farnworth et al. |
| 2007/0045515 A1 | 3/2007 | Farnworth et al. |
| 2007/0045632 A1 | 3/2007 | Oliver et al. |
| 2007/0045779 A1 | 3/2007 | Hiatt |
| 2007/0045806 A1 | 3/2007 | Hsuan |
| 2007/0045812 A1 | 3/2007 | Heng |
| 2007/0045826 A1 | 3/2007 | Lee et al. |
| 2007/0045834 A1 | 3/2007 | Chong et al. |
| 2007/0048896 A1 | 3/2007 | Andry et al. |
| 2007/0048994 A1 | 3/2007 | Tuttle |
| 2007/0049016 A1 | 3/2007 | Hiatt et al. |
| 2007/0049019 A1 | 3/2007 | Wai et al. |
| 2007/0057028 A1 | 3/2007 | Lake et al. |
| 2007/0077753 A1 | 4/2007 | Iwatake et al. |
| 2007/0082427 A1 | 4/2007 | Shirahama et al. |
| 2007/0096263 A1 | 5/2007 | Furukawa et al. |
| 2007/0099395 A1 | 5/2007 | Sridhar et al. |
| 2007/0111386 A1 | 5/2007 | Kim et al. |
| 2007/0138562 A1 | 6/2007 | Trezza |
| 2007/0145563 A1 | 6/2007 | Punzalan et al. |
| 2007/0152342 A1 | 7/2007 | Tsao et al. |
| 2007/0155997 A1 | 7/2007 | Li et al. |
| 2007/0158839 A1 | 7/2007 | Trezza |
| 2007/0158853 A1 | 7/2007 | Sinha |
| 2007/0161235 A1 | 7/2007 | Trezza |
| 2007/0166991 A1 | 7/2007 | Sinha |
| 2007/0166997 A1 | 7/2007 | Knorr |
| 2007/0167004 A1 | 7/2007 | Trezza |
| 2007/0170574 A1 | 7/2007 | Lauxtermann et al. |
| 2007/0178694 A1 | 8/2007 | Hiatt |
| 2007/0182020 A1 | 8/2007 | Trezza et al. |
| 2007/0190803 A1 | 8/2007 | Singh et al. |
| 2007/0197013 A1 | 8/2007 | Trezza |
| 2007/0202617 A1 | 8/2007 | Hembree |
| 2007/0222050 A1 | 9/2007 | Lee et al. |
| 2007/0222054 A1 | 9/2007 | Hembree |
| 2007/0228576 A1 | 10/2007 | Trezza |
| 2007/0228926 A1 | 10/2007 | Teo et al. |
| 2007/0262424 A1 | 11/2007 | Hiatt |
| 2007/0267138 A1 | 11/2007 | White et al. |
| 2007/0281473 A1 | 12/2007 | Clark et al. |
| 2007/0293040 A1 | 12/2007 | Emesh et al. |
| 2008/0006850 A1 | 1/2008 | Ribnicek et al. |
| 2008/0050904 A1 | 2/2008 | Lake |
| 2008/0050911 A1 | 2/2008 | Borthakur |
| 2008/0079120 A1 | 4/2008 | Foster et al. |
| 2008/0079121 A1 | 4/2008 | Han |
| 2008/0081386 A1 | 4/2008 | Raravikar et al. |
| 2008/0081398 A1 | 4/2008 | Lee et al. |

FOREIGN PATENT DOCUMENTS

| | | |
|---|---|---|
| EP | 1087648 A2 | 3/2001 |
| EP | 1157967 | 11/2001 |
| EP | 1415950 A2 | 5/2004 |
| JP | 63052432 | 3/1988 |
| JP | 02235589 | 9/1990 |
| JP | 2001077496 | 3/2001 |
| JP | 2001298147 | 10/2001 |
| JP | 2005093980 | 4/2005 |
| JP | 2005310817 | 11/2005 |
| KR | 20020022122 | 3/2002 |
| KR | 20020061812 | 7/2002 |
| WO | WO-2004054001 | 6/2004 |
| WO | 2004109770 A2 | 12/2004 |
| WO | WO-2005022965 | 3/2005 |
| WO | WO-2005036940 | 4/2005 |
| WO | WO-2006053036 | 5/2006 |
| WO | WO-2006124597 | 11/2006 |
| WO | WO-2007025813 | 3/2007 |
| WO | WO-2007043718 | 4/2007 |

OTHER PUBLICATIONS

Arunasalam, P. et al., "Thermo-Mechanical Analysis of Thru-Silicon-Via Based High Density Compliant Interconnect," Electronic Components and Technology Conference, 2007, ECTC '07, Proceedings, 57th, May 29, 2007 - Jun. 1, 2007, pp. 1179-1185.

Bernstein, K. et al., "Interconnects in the Third Dimension: Design Challenges for 3D ICs," Design Automation Conference, 2007, DAC '07, 44th ACM/IEEE, Jun. 4-8, 2007, pp. 562-567.

Cheung, T.S.D. et al., "On-Chip Interconnect for mm-Wave Applications Using an All-Copper Technology and Wavelength Reduction," 2003 IEEE International Solid-State Circuits Conference.

Chou, Bill et al., "Ultra Via Substrate for Advanced BGA Applications," Pan Pacific Symposium, Jan. 25, 2000, <http://www.smta.org/files/PanPac00-ChouBill.pdf>.

Lee, T.K. et al., "A Novel Joint-in-Via Flip-Chip Chip-Scale Package," IEEE Transactions on Advanced Packaging, vol. 29, No. 1, pp. 186-194, Feb. 2006.

Schaper, L. et al., "Integrated System Development for 3-D VLSI," Electronic Components and Technology Conference, 2007, ECTC '07, Proceedings, 57th, May 29, 2007- Jun. 1, 2007, pp. 853-857.

Tezcan, D.S. et al., "Sloped Through Wafer Vias for 3D Wafer Level Packaging," Electronic Components and Technology Conference, 2007, ECTC '07, Proceedings, 57th, May 29, 2007 - Jun. 1, 2007, pp. 643-647.

Trigas, C., "System-In-Package or System-On-Chip?," EE Times, Sep. 19, 2003, <http://www.eetimes.com/story/OEG20030919S0049>.

U.S. Appl. No. 11/774,419, filed Jul. 6, 2007, Hutto.
U.S. Appl. No. 11/514,568, filed Aug. 31, 2006, Tuttle.
U.S. Appl. No. 11/863,579, filed Sep. 28, 2007, Kheng.
U.S. Appl. No. 11/951,751, filed Dec. 6, 2007, Sulfridge.
U.S. Appl. No. 11/513,661, filed Aug. 30, 2006, Pratt.
U.S. Appl. No. 11/848, 836, filed Aug. 31, 2007, Jeung et al.

Aachboun, S. and P. Ranson, "Cryogenic etching of deep narrow trenches in silicon," J. Vac. Sci. Technol. A 18(4), Jul./Aug. 2000, pp. 1848-1852.

Aachboun, S. and P. Ranson, "Deep anisotropic etching of silicon," J. Vac. Sci. Technol. A 17(4), Jul./Aug. 1999, pp. 2270-2273.

Hirafune, S. et al., "Packaging Technology for Imager Using Through-hole Interconnection in Si Substrate," Proceeding of HDP'04, IEEE, pp. 303-306, Jul. 2004.

Kyocera Corporation, Memory Package, 1 page, retrieved from the Internet on Dec. 3, 2004, <http://global.kyocera.com/prdct/semicon/ic_pkg/memory_p.html>.

Lee, Rex A. et al., "Laser Created Silicon Vias for Stacking Dies in MCMs," IEEE/CHMT IEMT Symposium, 1991, pp. 262-265.

Rasmussen, F.E., et al., "Fabrication of High Aspect Ratio Through-Wafer Vias in CMOS Wafers for 3-D Packaging Applications," The 12th International Conference on Solid State Sensors, Actuators and Microsystems, Boston, Jun. 8-12, 2003.

Savastiouk, S. et al., "Thru-silicon interconnect technology," 26th IEEE/CPMT International Electronics Manufacturing Technology Symposium, 2000, abstract.

Takahashi, K. et al., "Through Silicon Via and 3-D Wafer/Chip Stacking Technology," 2006 Symposium on VLSI Circuits Digest of Technical Papers.

Takizawa, T. et al., "Conductive Interconnections Through Thick Silicon Substrates for 3D Packaging," The Fifteenth International Conference on Micro Electro Mechanical Systems, Las Vegas, Jan. 20-24, 2002.

XSiL, Via Applications, 1 page, <http://www.xsil.com/viaapplications/index.htm>, retrieved from the Internet on Jul. 22, 2003.

XSiL, xise200 for vies and micro-machining, <http://www.xsil.com/products/index/html>, retrieved from the Internet on Aug. 16, 2003.

XSiL, Vias for 3D Packaging, 1 page, <http://www.xsil.com/viaapplications/3dpackaging/index.htm>, retrieved from the Internet on Jul. 22, 2003.

Yamamoto, S. et al., "Si Through-Hole Interconnections Filled with Au-Sn Solder by Molten Metal Suction Method," pp. 642-645, IEEE, MEMS-03 Kyoto, The Sixteenth Annual International Conference on Micro Electro Mechanical Systems, Jan. 2003, ISBN 0-7803-7744-3.

Blackburn, J.M. et al., "Deposition of Conformal Copper and Nickel Films from Supercritical Carbon Dioxide," Science, vol. 94, Oct. 2001, pp. 141-145.

De Boer, M.J. et al., "Micromachining of Buried Micro Channels in Silicon," Journal of Microelectromechanical Systems, vol. 9, No. 1, Mar. 2000, IEEE, ISSN: 1057-7157.

Jang, D.M. et al., "Development and Evaluation of 3-D SiP with Vertically Interconnected Through Silicon Vias (TSV)," Proceedings of the 57th Electronic Components and Technology Conference, IEEE, May 29 2007 - Jun. 1 2007, pp. 847-852, ISBN: 1-4244-0985-3.

Keigler, A. et al., "Enabling 3-D Design," Semiconductor International, Aug. 2007.

Kim, J.Y. et al., "S-RCAT (Sphere-shaped-Recess-Channel-Array Transistor) Technology for 70nm DRAM Feature Size and Beyond," 2005 Symposium on VLSI Technology, Digest of Technical Papers, Jun. 14-16, 2005, pp. 34-35, IEEE, ISBN: 4-900784-02-8.

Lee, H.M. et al., Abstract of "Abatement of Sulfur Hexaflouride Emissions from the Semiconductor Manufacturing Process by Atmospheric-Pressure Plasmas," 1 page, Aug. 2004, <http:www.awma.org/journal/ShowAbstract.asp?Year=&PaperID=1256>.

Morrow, P.R. et al., "Three-Dimensional Wafer Stacking Via Cu-Cu Bonding Integrated With 65-nm Strained-Si/ Low-k CMOS Technology," IEEE Electron Device Letters, vol. 27, No. 5, pp. 335-337, May 2006, ISBN: 0741-3106.

Thomas, D.J. et al., "Etching of Vias and Trenches Through Low k Dielectrics with Feature Sizes Down to 0.1 mm Using M0RIO High Density Plasmas," presented at the 197th Meeting of the Electrochemical Society, Toronto 2000, <http://www.trikon.com/pdfs/ECS2b.pdf>.

Search Report and Written Opinion for Singapore Application No. 200505627-0, Jul. 11, 2008.

* cited by examiner

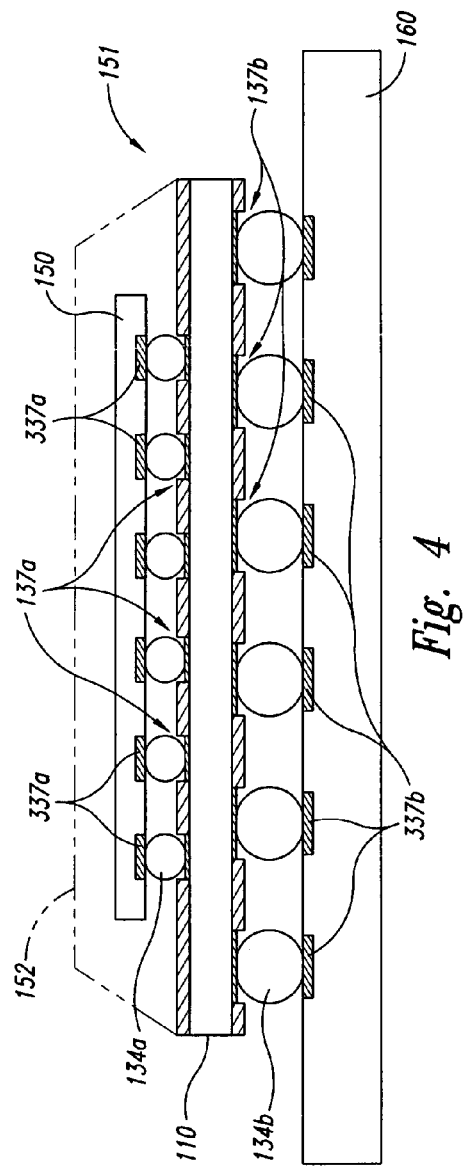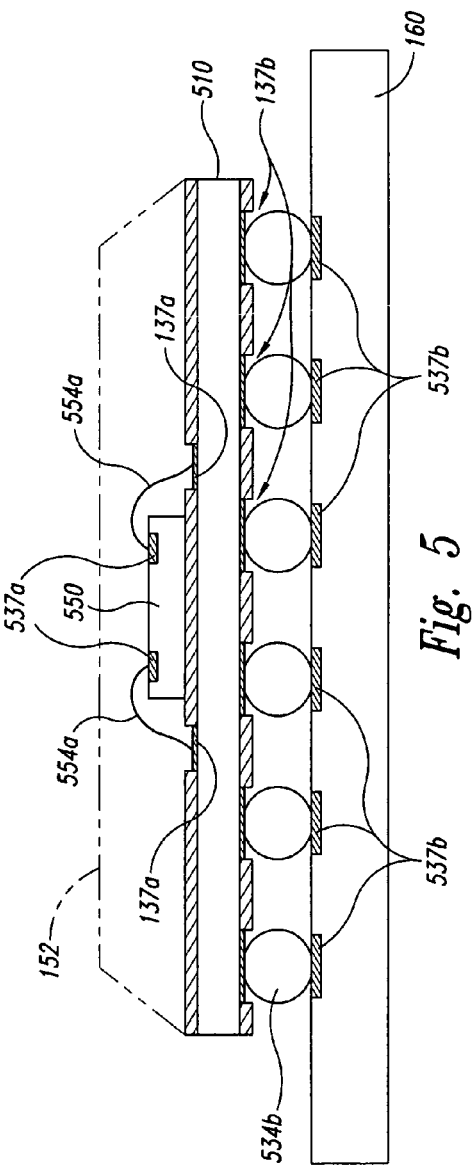

MICROFEATURE WORKPIECE SUBSTRATES HAVING THROUGH-SUBSTRATE VIAS, AND ASSOCIATED METHODS OF FORMATION

TECHNICAL FIELD

The present invention is directed generally toward microfeature workpiece substrates having through-substrate vias, and associated methods of formation.

BACKGROUND

Packaged microelectronic assemblies, such as memory chips and microprocessor chips, typically include a microelectronic die mounted to a substrate (e.g., an interposer board) and encased in a plastic protective covering. The die includes functional features, such as memory cells, processor circuits, and interconnecting circuitry. The die also typically includes die bond pads that are electrically coupled to the functional features. The bond pads are coupled to corresponding first bond pads on the substrate (e.g., with wirebonds), and this connection is protected with the plastic protective covering. The first substrate bond pads can be coupled to second substrate bond pads on an opposite surface of the substrate via pathways that are internal to the substrate. The second bond pads can in turn be connected to external devices, for example, using solder balls. Accordingly, the substrate can have one or more layers of conductive material (e.g., copper) that is etched or otherwise configured to form the first substrate bond pads and the second substrate bond pads.

In a typical operation, the substrate bond pads are built up in an electrolytic plating operation using a bus formed from the conductive layers to transmit electrical current to the bond pads. One drawback with the bus is that it can act as an antenna and can accordingly create extraneous signals, which may interfere with the operation of the microelectronic die. Accordingly, several techniques have been developed for forming bond pads on a substrate without requiring that a bus remain in the substrate. While these techniques have met with at least some success, they have also been subject to several drawbacks. These drawbacks can include undercutting the conductive material at the bond pads and/or difficulty in obtaining very fine pitch spacing between adjacent bond pads. As the size of microelectronic dies continues to decrease, and performance demands on the microelectronic dies continues to increase, these drawbacks can in some cases place undesirable design and/or performance limitations on the microelectronic dies.

BRIEF DESCRIPTION OF THE DRAWINGS

FIG. 4 illustrates a packaged microelectronic device having a substrate coupled to an external device in accordance with an embodiment of the invention.

FIG. 5 illustrates a packaged microelectronic device having a substrate coupled to an external device in accordance with another embodiment of the invention.

DETAILED DESCRIPTION

A. Introduction

Figure 1A:
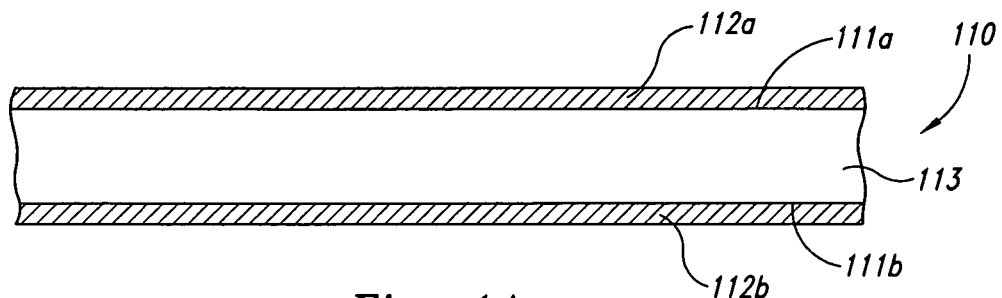
FIGS. 1A-1F illustrate an initial series of steps for forming a substrate without a permanent bus, in accordance with an embodiment of the invention.

Microfeature workpiece substrates having through-substrate vias, and associated methods of formation are described below. In particular aspects, the through-substrate vias can allow the formation of bond pads on one surface without requiring a bus at that surface. Instead, electrical current for forming the bond pads in an electrolytic process can be provided by a conductive path that extends through the via. A method for forming a support substrate for carrying microfeature dies in accordance with one aspect of the invention includes exposing a substrate to an electrolyte, wherein the substrate has a first side with a first conductive layer, a second side opposite the first side with a second conductive layer, and a conductive path extending through the substrate from the first conductive layer to the second conductive layer. The method can further include forming a bond pad at a bond site of the first conductive layer by disposing at least one conductive bond pad material at the bond site. The process of disposing the at least one conductive bond pad material can include passing an electrical current between the first and second conductive layers via the conductive path, while the substrate is exposed to the electrolyte.

In further particular aspects, the method can include patterning the first conductive layer to form a bond site, and applying bond pad material to the bond site after patterning the first conductive layer. In still another aspect, the method can include applying an at least generally non-removable protective coating over the first conductive layer, preventing the protective coating from covering the bond site (or removing the protective coating from the bond site) and applying bond pad material to the bond site after applying the protective coating.

In yet another aspect, the method can include forming a bond pad at a first bond site of the first conductive layer and at a second bond site of the second conductive layer. This process can further include (a) placing a removable protective coating over the second conductive layer, (b) preventing the removable protective coating from covering the second bond site or removing the protective coating from the second bond site, and (c) applying conductive material to the first and second bond sites simultaneously, after performing processes (a) and (b). The method can still further include (d) removing the removable protective coating from the second conductive layer, and (e) patterning the second conductive layer by removing a portion of the second conductive layer while leaving the second bond site electrically coupled to the first bond site via the conductive path.

In still further aspects, the invention can include a microelectronic system comprising a substrate configured to carry a microfeature die, with the substrate having a first surface with a first conductive layer and a second surface facing opposite from the first surface and having a second conductive layer. The first conductive layer can have multiple first bond sites, and the second conductive layer can have multiple second bond sites. The system can further comprise conductive bond pad material positioned at the first bond sites to form first bond pads, with the first bond pads being separated from each other by a first average spacing, and with the bond pad material extending around an edge of the first conductive layer at the first bond sites. Conductive bond pad material can also be positioned at the second bond sites to form second bond pads, with the first and second bond pads being electrically coupled with conductive pathways extending through the substrate. The second bond pads can be separated from each other by a second average spacing greater than the first average spacing. The bond pad material can have a different arrangement at the second bond sites than at the first bond sites. For example, the bond pad material at the second bond site can be spaced apart from an edge of the second conductive layer at the second bond sites.

As used herein, the terms "microfeature workpiece" and "workpiece" refer to substrates on and/or in which microelectronic devices are integrally formed. Typical microelectronic devices include microelectronic circuits or components, thin-film recording heads, data storage elements, microfluidic devices and other products. Micromachines and micromechanical devices are included within this definition because they are manufactured using much of the same technology that is used in the fabrication of integrated circuits. The microfeature workpiece can be a semiconductive piece (e.g., doped silicon wafers or gallium arsenide wafers) nonconductive pieces (e.g., various ceramic substrates) or conductive pieces. In some cases, the workpieces are generally round, and in other cases, the workpieces have other shapes, including rectilinear shapes.

The term "support substrate" is used generally herein to refer to a support member that carries the microfeature workpiece and provides an interface between the microfeature workpiece and external devices to which the microfeature workpiece may be electrically coupled. Accordingly, the term "support substrate" can include, but is not limited to, interposer boards, printed circuit boards, and/or other structures that can provide physical support and/or electrical connections for the microfeature workpiece and that generally do not include integrated semiconductor features.

B. Support Substrates and Associated Methods of Formation

FIGS. 1A-2D illustrate a series of process steps that may be performed to produce a support substrate having features in accordance with several embodiments of the invention. Referring first to FIG. 1A, the support substrate 110 can include a core material 113 having a first side or surface 111a and a second side or surface 111b facing opposite from the first surface 111a. A first conductive layer 112a can be positioned against the first surface 111a, and a second conductive layer 112b can be positioned against the second surface 111b. The substrate 110 can include a printed circuit board, with the core 113 including a ceramic material, and the first and second conductive layers 112a, 112b including generally planar layers of copper. In other embodiments, these components can have different compositions and/or arrangements.

Figure 1B:
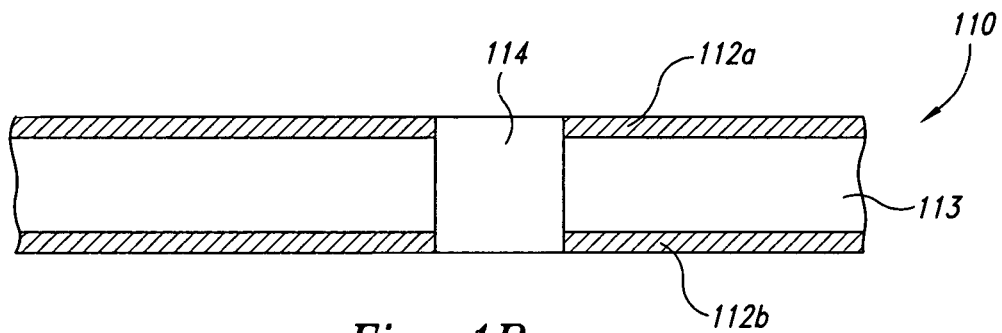
Figure 1C:
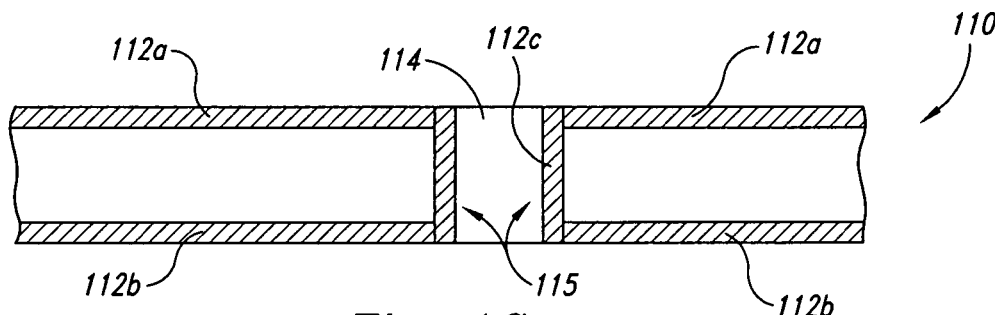

Referring next to FIG. 1B, a via 114 can be formed to extend through the core 113 and through the first and second conductive layers 112a, 112b. As shown in FIG. 1C, the via 114 can be coated with a third conductive layer 112c to form a conductive path 115 that electrically connects the first conductive layer 112a and the second conductive layer 112b. The third conductive layer 112c can be formed using a conventional combination of electroless and electrolytic plating techniques. For example, an electroless technique can be used to apply a seed layer to the walls of the via 114, and an electrolytic technique can be used to add thickness to the seed layer, forming the overall structure of the third conductive layer 112c.

Figure 1D:
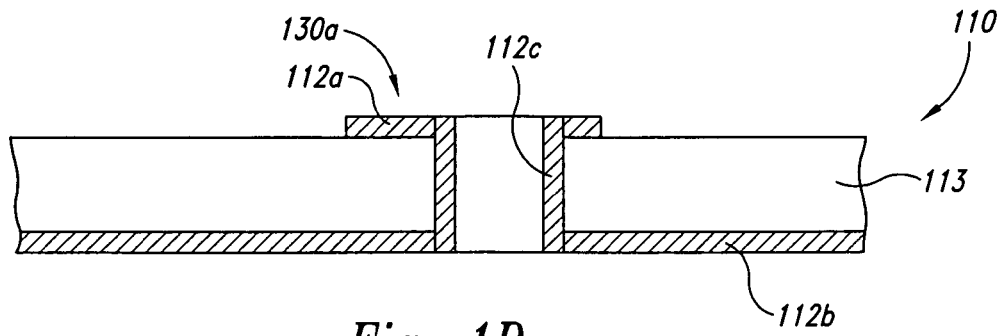

In FIG. 1D, the first conductive layer 112a can be patterned to remove the bulk of the first conductive layer 112a, with the exception of at least one first bond site 130a located adjacent to the first surface 111a of the core material 113. For purposes of illustration, only one first bond site 130a is shown in FIGS. 1D-2D and described in the associated text. However, it will be understood by those of ordinary skill in the art that the support substrate 110 can include additional first bond sites 130a at other locations, within and/or transverse to the plane of FIG. 1D. In any of these embodiments, for at least some of the first bond sites 130a, no electrical connection exists between the first bond site 130a and other first bond sites located at the first surface 111a after the patterning process has been completed. In particular, each first bond site 130a can be electrically independent of other features at the first surface 111a. Accordingly, the first conductive layer 112a need not include an electrically conductive bus. Instead, as will be described later, electrical current for carrying out manufacturing processes at the first bond site 130a can be provided by the second conductive layer 112b and the conductive path 115.

The first bond site 130a can be formed using any of a variety of conventional patterning techniques. Such techniques can include disposing a layer of photoresist or another protective coating on the first conductive layer 112a, patterning the photoresist to remove portions of the photoresist over portions of the first conductive layer 112a that do not correspond to the first bond site 130a, and then exposing the first conductive layer 112a to an etchant that removes all or generally all of the first conductive layer 112a except at the location corresponding to the first bond site 130a.

Figure 1E:
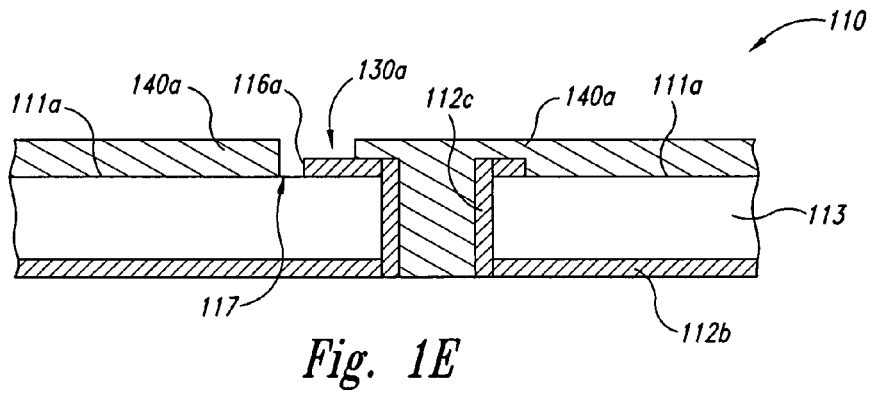

Referring next to FIG. 1E, a first protective coating 140a can be disposed over the first surface 111a and the first conductive layer 112a, except over the first bond site 130a. In a particular aspect of this embodiment, the first protective coating 140a can include a soldermask or other material that remains permanently attached to the support substrate 110 after processing. For example, the first protective coating 140a can include a soldermask material that is patterned in a manner generally similar to that described above with reference to FIG. 1D, but which is then treated (e.g., by exposure to radiation, heat, or another energy source) to form a generally permanent coating. As used herein, the term "at least generally permanent" refers to a material that remains with the support substrate 110 after processing, and that is not removed (or at least not entirely removed) during the manufacturing process and/or prior to coupling the support substrate 110 to a microfeature die or other device for an end-user.

As is also shown in FIG. 1E, the first protective coating 140a can be applied so that a gap 117 exists between a first conductive layer edge 116a and the first protective coating 140a. As described in greater detail below with reference to FIG. 2A, the gap 117 can allow for a more extensive application of bond pad material at the first bond site 130a.

Figure 1F:
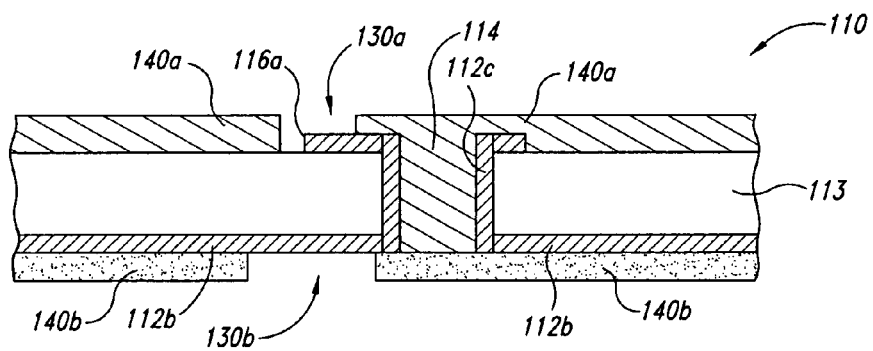

Referring next to FIG. 1F, a second protective coating 140b can be applied to the second conductive layer 112b. The second protective coating 140b can be patterned in a manner generally similar to that described above to expose or keep exposed a second bond site 130b. Unlike the first protective coating 140a, however, the second protective coating 140b can be completely removed during subsequent processing steps. Accordingly, the second protective coating 140b can include a dry film or other patternable, removable material. For purposes of illustration, the second bond site 130b is shown more or less directly beneath the first bond site 130a; however, in many cases, the second bond site 130b can be positioned further away from the via 114. This can result in larger spacings (e.g., coarser pitch) between adjacent second bond sites 130b than between adjacent first bond sites 130a.

FIGS. 2A-2D illustrate process steps for providing additional conductive material at the first bond site 130a and the second bond site 130b (referred to collectively as bond sites 130). The additional conductive material applied to the bond sites 130 can provide for enhanced electrical connectivity between the bond sites 130 and the structures to which the bond sites are electrically coupled. In the case of the first bond site 130a, the coupling can be to a microelectronic die that the support substrate 110 carries and is packaged with. In the case of the second bond site 130b, the connection can be to an external device.

Figure 2A:
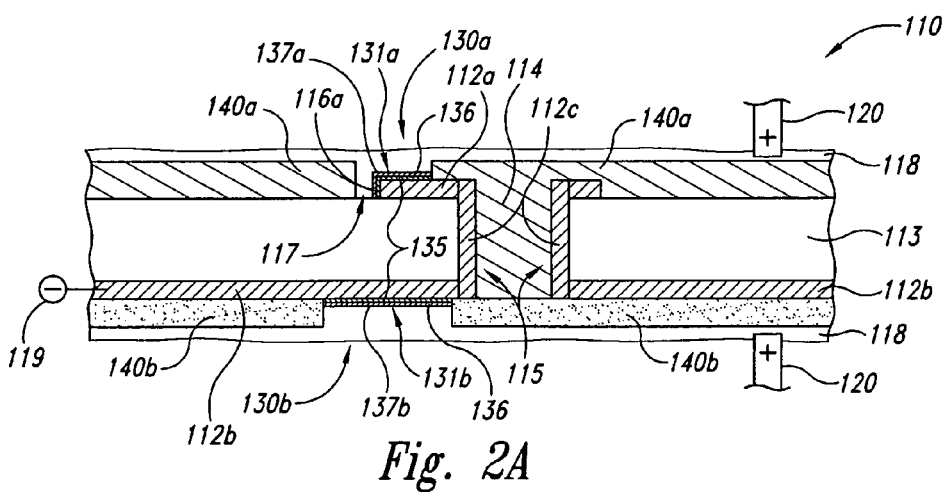
FIGS. 2A-2D illustrate subsequent steps for forming the substrate initially shown in FIGS. 1A-1F.

Beginning with FIG. 2A, the support substrate 110 can be disposed in an electrolyte 118, and a cathode 119 can be applied to the second conductive layer 112b. One or more anodes 120 can be positioned in electrical communication with the electrolyte 118 to complete the electrical circuit used for electrolytically applying material to the first bond sites 130. The differences in electrical potential between the anode 120 and cathode 119 provides for the current flow. At this point, the second conductive layer 112b can be generally continuous over the second surface 111b of the support substrate 110, with the exception of local discontinuities at the vias 114. Accordingly, the second conductive layer 112b can provide a highly conductive, low resistance link to the second bond site 130b. The second conductive layer 112b can also provide a highly conductive, low resistance link to the first bond site 130a, via the conductive path 115 formed by the third conductive layer 112c extending through the via 114.

During the electrolytic process, a first bond pad material 131a can be applied to the first bond site 130a and can form a first bond pad 137a. A second bond pad material 131b can be applied to the second bond site 130b to form a second bond pad 137b. The first and second bond pad materials 131a, 131b are referred to collectively as bond pad material 131. The bond pad material 131 can include a single constituent or a composite of constituents. For example, in one embodiment, the bond pad material 131 can include both nickel and gold, arranged in layers with a nickel layer 135 placed adjacent to the underlying conductive layer 112a, 112b, and with a gold layer 136 positioned against the nickel layer 135. In other embodiments, the bond pad material 131 can include composites of different conductive materials, or a single layer of a homogenous material. In any of these embodiments, the first bond pad material 131a can at least partially fill the gap 117 between the first protective coating 140a and the edge 116 of the first conductive layer 112a. The presence of the gap 117 can allow the first bond pad material 131a to wrap around the edge 116a of the first conductive layer 112a. In particular, the first bond pad material 131a need not be offset away from the edge 116a of the first conductive layer 112a. This feature can be enabled by (a) patterning the first conductive layer 112a before applying the first bond pad material 131a, and (b) using a soldermask or similar material for the first protective coating 140a. As a result, the first bond site 130a can have a relatively large amount of first bond pad material 131a accessible for electrical coupling, even though the first bond site 130a itself may be relatively small to allow for close spacing between adjacent first bond sites 130a.

Figure 2B:
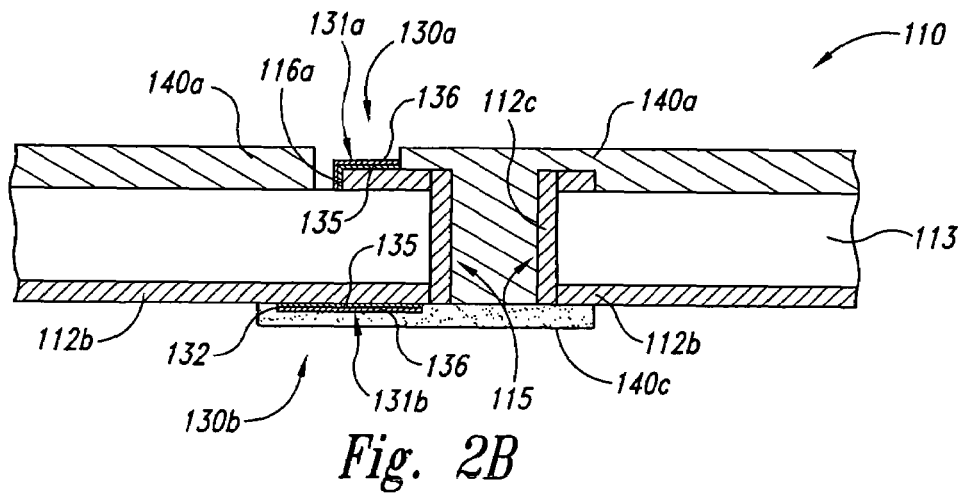

After the bond pad material 131 has been applied to the bond sites 130, the second protective coating 140b can be removed from the second conductive layer 112b. Afterwards, the second conductive layer 112b can be patterned to remove conductive material other than that located at the second bond site 130b. Referring now to FIG. 2B, a third protective coating 140c can be disposed over the second conductive layer 112b, and can then be patterned to protect the second bond site 130b and the conductive path 115 through the via 114. Accordingly, the third protective coating 140c can include a temporary or otherwise removable, patternable material (e.g., a dry film, generally similar to the second protective coating 140b described above). In a particular aspect of this embodiment, the third protective coating 140c can extend around an edge 132 of the second bond pad material 131b to protect the entire volume of the second bond pad material 131b. As a result, the portion of the second conductive layer 112b of the second bond site 130b can be protected from being undercut when adjacent portions of the second conductive layer 112b are removed.

Figure 2C:
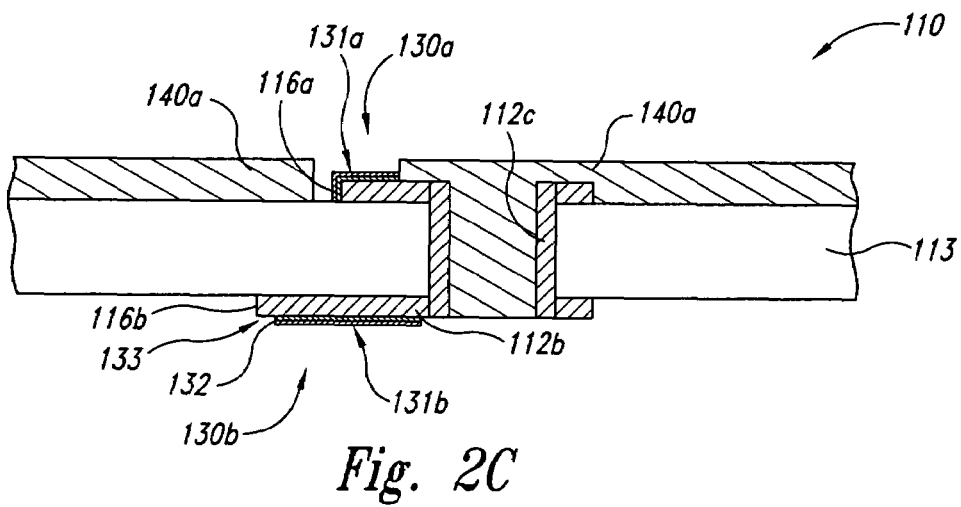

Referring next to FIG. 2C, portions of the second conductive layer 112b surrounding the second bond site 130b can be removed (e.g., via an etching process), after which the third protective coating 140c itself can also be removed. The second bond site 130b can include an offset 133 between an edge 132 of the second bond pad material 131b, and an edge 116b of the second conductive material 112b. The formation of this offset 133 results from the fact that the third protective coating 140c was placed around the edge 132 during the process described above with reference to FIG. 2B. This offset 133 can result in a slight increase in the overall size of the second bond site 130b (particularly in comparison to the first bond site 130a). However, this increase in size is not expected to create undesirable increases in the spacing between adjacent second bond sites 130b, because, on the second surface 112b of the substrate 110, bond site spacing is not as critical. In particular, the second bond sites 130b are intended to align with corresponding bond pads of external devices, which typically do not have bond pad pitch requirements as stringent as those for microfeature workpieces that are attached to the first bond sites 130a.

Figure 2D:
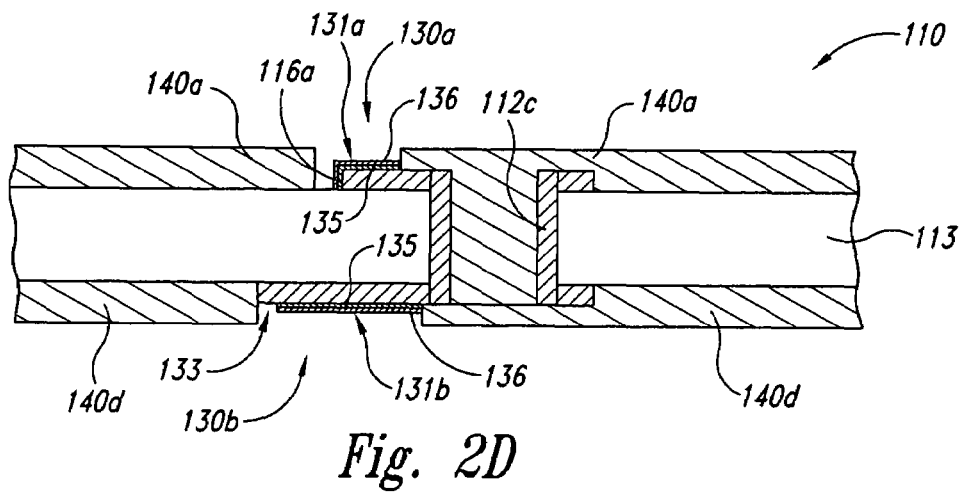

In FIG. 2D, a fourth protective coating 140d is applied to the second surface 111b to provide for an at least generally permanent covering over the portions of the substrate 110 adjacent to the second bond site 130b. Accordingly, the fourth protective coating 140d can include a solder mask material that is either applied to (and then removed from) the second bond site 130b, or prevented from adhering to the second bond site 130b with an appropriate removable masking material. The support substrate 110 is now available for coupling to microfeature workpieces, and subsequently to external devices.

C. Support Substrates and Associated Installations

Figure 3:
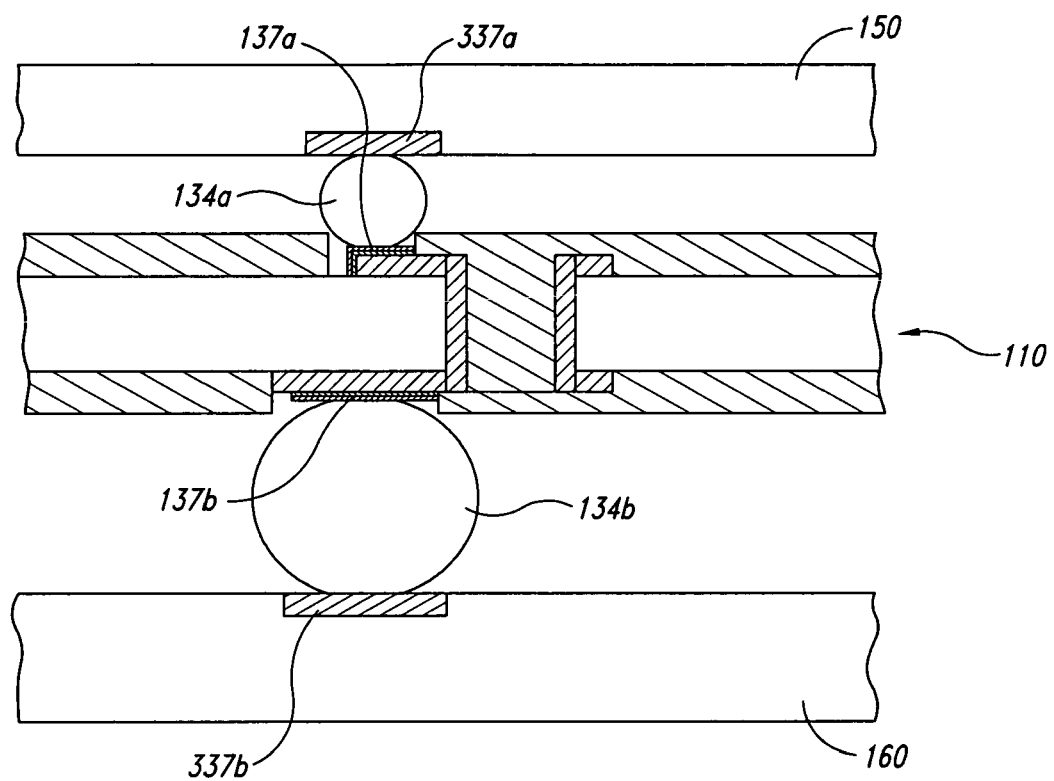
FIG. 3 is an enlarged illustration of a portion of a substrate configured in accordance with an embodiment of the invention, shown coupled to a microfeature workpiece and an external device.

FIG. 3 is an enlarged, partially schematic illustration of a portion of the substrate 110, coupled to both a microfeature workpiece 150 and an external device 160. In one aspect of this embodiment, the substrate 110 can be coupled to the microfeature workpiece 150 via a first conductive coupler 134a (e.g., a small solder ball) that extends between the first pad 137a and a corresponding bond pad 337a of the microfeature workpiece 150. The substrate 110 can be coupled to the external device 160 with a second conductive coupler 134b (e.g., a larger solder ball) that extends between the second bond pad 137b and a corresponding bond pad 337b of the external device 160. The external device 160 can Include a printed circuitboard or other device that is in electrical communication with the microfeature workpiece 150 by virtue of the interposed substrate 110.

FIG. 4 is an overall view illustrating the microfeature workpiece 150 positioned on the support substrate 110 and surrounded by an encapsulant 152 to form a packaged microelectronic device 151. This arrangement, typically referred to as a flip chip arrangement, includes a relatively fine pitch between the first bond pads 137a to accommodate the relatively close spacing of the corresponding bond pads 337a on the microfeature workpiece 150, and a coarser spacing of the second bond pads 137b. As discussed above, the second bond pads 137b typically need not be as closely spaced as the first bond pads 137a because the pitch requirements of the bond pads 337b on external device 160 are generally not as stringent as the pitch requirements of the microfeature workpiece 150.

In other embodiments, support substrates generally similar to those described above can be used in other arrangements. For example, referring now to FIG. 5, a support substrate 510 can be configured to support a microfeature workpiece 550 in a chip-on-board (COB) arrangement. Accordingly, the microfeature workpiece 550 can be electrically coupled to the support substrate 510 with first conductive couplers 554a that include wirebonds extending between the first bond pads 137a of the support substrate 510, and corresponding bond sites 537a on an upper surface of the microfeature workpiece 550. Second conductive couplers 534b (which can include solder balls) can extend between the second bond pads 137b and corresponding bond pads 537b of the external device 160. An encapsulant 552 can be positioned around the microfeature workpiece 550 and the support substrate 510 to form the packaged microelectronic device 551. In still other embodiments, the support substrate 510 can be configured to support microfeature workpieces in accordance with other configurations and/or arrangements.

One feature of embodiments of the support substrates and associated manufacturing methods described above is that the conductive bond pad material 131a can be applied to the first bond site 130a without the need for a bus at the first surface of the support substrate 110. Instead, electrical power for applying the first bond pad material 130a can be provided by applying current to the second conductive layer 112b and using the conductive path 115 provided by the via 114 to conduct electrical current to the first bond site 130a. An advantage of this arrangement is that the first bond pad 137a can be formed without a bus and accordingly, the potentially negative effects associated with a bus (e.g., extraneous signals that may result when the bus acts as an antenna), may be eliminated.

Another feature of embodiments of the support substrate described above is that the first bond pad material 131a can cover not only the outwardly facing surface of the first conductive material 112a at the first bond site 130a, but can also cover the adjacent edge 116. An advantage of this arrangement is that it can eliminate or at least reduce the likelihood that subsequent etching processes will undercut the first conductive layer 112a at the edge 116, by virtue of the protection afforded by the first bond pad material 131a at this location. As a result, the physical and electrical characteristics of the first bond pad 137a can be more robust than corresponding bond pads formed by other methods.

Another feature of embodiments of the support substrate described above is that the first bond material 131a is not offset from the edge of the first conductive layer 112a immediately below (unlike the second bond pad material 130b, which is offset from the edge of the corresponding second conductive layer 112b by an offset 133). An advantage of this arrangement is that it can provide for a greater surface area of highly conductive material at the first bond site 130a than would be available if the first bond pad material 131a were offset from the underlying first conductive layer 112a. This can allow the overall size of the first bond site 130a to be reduced (because the available area at the first bond site 130a is more effectively utilized) and can accordingly allow adjacent first bond pads 137a to be spaced more closely together. An advantage of this arrangement is that it can allow for electrical connections (via solder balls or other structures) to corresponding microfeature workpieces that have very fine bond pad pitch spacings.

From the foregoing, it will be appreciated that specific embodiments of the invention have been described herein for purposes of illustration, but that various modifications may be made without deviating from the invention. For example, in some embodiments, the bond sites can have arrangements different than those described above. Many of the Figures illustrate features of the disclosed embodiments in a schematic fashion. Accordingly, many of these features may have dimensions and/or relative dimensions that are different than those illustrated in the Figures. Aspects of the invention described in the context of particular embodiments may be combined or eliminated in other embodiments. Further, while advantages associated with certain embodiments of the invention have been described in the context of those embodiments, other embodiments may also exhibit such advantages, and not all embodiments need necessarily exhibit such advantages to fall within the scope of the invention. Accordingly, the invention is not limited, except as by the appended claims.

We claim:

1. A method for forming a support substrate for carrying microfeature dies, comprising:

exposing a support substrate to an electrolyte, the support substrate having a first side with a first conductive layer, a second side opposite the first side with a second conductive layer, and a conductive path extending through the support substrate from the first conductive layer to the second conductive layer; and forming a bond pad at a bond site of the first conductive layer by removing a portion of the first conductive layer adjacent to the bond site and disposing at least one conductive bond pad material at the bond site, wherein disposing the at least one conductive bond pad material includes passing an electrical current between the first and second conductive layers via the conductive path while the support substrate is exposed to the electrolyte, wherein passing the electrical current is carried out by a process that includes applying an electrical potential to the second conductive layer without applying the electrical potential to the first conductive layer, other than through the conductive path.

2. The method of claim 1, further comprising forming a hole in the support substrate and disposing a conductive material in the hole to connect the first and second conductive layers.

3. The method of claim 1, further comprising applying the electrical potential to the second conductive layer while the second conductive layer covers at least approximately the entire second side.

4. The method of claim 1, further comprising applying the electrical potential to the second conductive layer prior to patterning the second conductive layer to form bond pads at the second conductive layer.

5. The method of claim 1, further comprising patterning the first conductive layer to remove conductive material adjacent to the bond site.

6. The method of claim 1, further comprising:
patterning the first conductive layer to remove conductive material adjacent to the bond site; and
applying bond pad material to the bond site after patterning the first conductive layer.

7. The method of claim 1, further comprising:
applying an at least generally permanent protective coating over the first conductive layer;
preventing the protective coating from covering the bond site, or removing the protective coating from the bond site; and applying bond pad material to the bond site after applying the protective coating.

8. The method of claim 1, further comprising:
applying a soldermask coating over the first conductive layer;
removing the soldermask coating from the bond site;
treating the soldermask material to inhibit its removal from regions adjacent to the bond site; and
applying bond pad material to the bond site after applying the soldermask coating.

9. The method of claim 1 wherein the bond site includes a first bond site, and wherein the method further comprises disposing bond pad material at a second bond site of the second conductive layer.

10. The method of claim 1 wherein disposing bond pad material includes disposing at least one of nickel and gold.

11. The method of claim 1 wherein disposing bond pad material includes disposing the bond pad material to wrap around an exposed edge of the first conductive layer at the bond site.

12. The method of claim 1 wherein exposing a support substrate to an electrolyte includes exposing a printed circuit board to the electrolyte.

13. The method of claim 1 wherein exposing a support substrate to an electrolyte includes exposing a support substrate that is configured to carry a microelectronic die having semiconductor features, but that by itself does not include semiconductor features.

14. A method for forming a support substrate for carrying microfeature dies, comprising:
exposing a support substrate to an electrolyte, the support substrate having a first side with a first conductive layer, a second side opposite the first side with a second conductive layer, and a conductive path extending through the support substrate from the first conductive layer to the second conductive layer; and
forming bond pads at a first bond site of the first conductive layer and at a second bond site of the second conductive layer by removing conductive layer material adjacent to at least one of the bond sites and by disposing at least one conductive bond pad material at the bond sites, wherein disposing the at least one conductive bond pad material includes applying an electrical potential to the second conductive layer and passing an electrical current between the first conductive layer and the second conductive layer via the conductive path while the support substrate is exposed to the electrolyte, wherein the electrical potential is communicated to the first conductive layer only via the conductive path.

15. The method of claim 14 wherein the first bond pad site is one of multiple first bond pad sites, and wherein the second bond pad site is one of multiple second bond pad sites, and wherein forming the bond pads includes forming the first bond pads to have a first pitch and forming the second bond pads to have a second pitch coarser than the first pitch.

16. The method of claim 14, further comprising
applying an at least generally permanent protective coating over the first conductive layer;
preventing the protective coating from covering the first bond site, or removing the protective coating from the first bond site; and wherein
disposing bond pad material at the bond pad sites includes disposing the bond pad material after applying the protective coating.

17. A method for forming a support substrate for carrying microfeature dies, comprising:

(a) exposing a support substrate to an electrolyte, the support substrate having a first side with a first conductive layer, a second side opposite the first side with a second conductive layer, and a conductive path extending through the support substrate from the first conductive layer to the second conductive layer;
(b) forming bond pads at a first bond site of the first conductive layer and at a second bond site of the second conductive layer by removing conductive layer material adjacent to at least one of the bond sites and by disposing at least one conductive bond pad material at the bond sites, wherein disposing the at least one conductive bond pad material includes applying an electrical potential to the second conductive layer and passing an electrical current between the first conductive layer and the second conductive layer via the conductive path while the support substrate is exposed to the electrolyte, wherein the electrical potential is communicated to the first conductive layer only via the conductive path;
(c) placing a removable protective coating over the second conductive layer;
(d) preventing the removable protective coating from covering the second bond site, or removing the protective coating from the second bond site;
(e) applying conductive material to the first and second bond sites simultaneously, after performing processes (c) and (d);
(f) removing the removable protective coating from the second conductive layer; and
(g) patterning the second conductive layer by removing a portion of the second conductive layer while leaving the second bond site electrically coupled to the first bond site via the conductive path.

18. The method of claim 17, further comprising:
(h) applying an at least generally permanent protective coating over the first conductive layer;
(i) preventing the protective coating from covering the first bond pad site, or removing the protective coating from the bond site; and wherein
applying conductive material is performed after performing processes (c), (d), (h) and (i).

19. A method for forming a support substrate for carrying microfeature dies, comprising:
(a) exposing a support substrate to an electrolyte, the support substrate having a first side with a first conductive layer, a second side opposite the first side with a second conductive layer, and a conductive path extending through the support substrate from the first conductive layer to the second conductive layer;
(b) forming bond pads at a first bond site of the first conductive layer and at a second bond site of the second conductive layer by removing conductive layer material adjacent to at least one of the bond sites and by disposing at least one conductive bond pad material at the bond sites, wherein disposing the at least one conductive bond pad material includes applying an electrical potential to the second conductive layer and passing an electrical current between the first conductive layer and the second conductive layer via the conductive path while the support substrate is exposed to the electrolyte, wherein the electrical potential is communicated to the first conductive layer only via the conductive path;
(c) placing a removable protective dry film coating over the second conductive layer;
(d) preventing the removable protective dry film coating from covering the second bond site, or removing the protective dry film coating from the second bond site;

(e) applying conductive material to the first and second bond sites simultaneously, after performing processes (c) and (d);
(f) removing the removable protective dry film coating from the second conductive layer; and
(g) patterning the second conductive layer by removing a portion of the second conductive layer while leaving the second bond site electrically coupled to the first bond site via the conductive path.

20. A method for forming a support substrate for carrying microfeature dies, comprising:
patterning a first conductive layer on a first surface of a support substrate by removing a portion of the first conductive layer to form a bond site at the first surface, wherein the support substrate has a second surface facing opposite from the first surface, the second surface having a second conductive layer, and wherein the support substrate further includes a conductive path extending through the support substrate from the first conductive layer to the second conductive layer; and
after patterning the first conductive layer, forming a bond pad at a bond site of the first conductive layer by passing an electrical current through the first and second conductive layers via the conductive path while the support substrate is exposed to an electrolyte, wherein passing the electrical current includes applying an electrical potential to the second conductive layer and communicating the electrical potential to the first conductive layer via the conductive path.

21. The method of claim 20 wherein passing an electrical current includes passing an electrical current while the second conductive layer covers at least approximately the entire second side.

22. The method of claim 20 wherein passing an electrical current includes passing an electrical current prior to patterning the second conductive layer to form bond pads at the second conductive layer.

23. The method of claim 20, further comprising:
applying an at least generally permanent protective coating over the first conductive layer;
preventing the protective coating from covering the bond site, or removing the protective coating from the bond site; and
applying bond pad material to the bond site after applying the protective coating.

24. The method of claim 20 wherein the bond site includes a first bond site, and wherein the method further comprises disposing bond pad material at a second bond site of the second conductive layer.

25. The method of claim 20 wherein exposing a support substrate to an electrolyte includes exposing a support substrate that is configured to carry a microelectronic die having semiconductor features, but that by itself does not include semiconductor features.

26. A method for forming a support substrate for carrying microfeature dies, comprising:
(a) patterning a first conductive layer on a first surface of a support substrate by removing a portion of the first conductive layer to form a first bond site at the first surface, wherein the support substrate has a second surface facing opposite from the first surface, the second surface having a second conductive layer, and wherein the support substrate further includes a conductive path extending through the support substrate from the first conductive layer to the second conductive layer;
(b) after patterning the first conductive layer, forming a bond pad at the first bond site of the first conductive layer by passing an electrical current through the first and second conductive layers via the conductive path while the support substrate is exposed to an electrolyte, wherein passing the electrical current includes applying an electrical potential to the second conductive layer and communicating the electrical potential to the first conductive layer via the conductive path;
(c) placing a removable protective dry film coating over the second conductive layer;
(d) preventing the removable protective dry film coating from covering a second bond pad site at the second conductive layer, or removing the protective dry film coating from the second bond site;
(e) applying a generally permanent protective coating to the first conductive layer and exposing or leaving exposed the first bond site
(f) applying conductive material to the first and second bond sites simultaneously, after performing processes (c), (d) and (e)
(g) removing the removable protective dry film coating from the second conductive layer;
(h) patterning the second conductive layer by removing a portion of the second conductive layer while leaving the second bond site electrically coupled to the first bond site via the conductive path; and
(i) applying a generally permanent protective coating over the second conductive layer after patterning the second conductive layer.

27. A method for forming a support substrate for carrying microfeature dies, comprising:
applying an at least generally permanent protective coating over a first conductive layer of a support substrate, wherein the first conductive layer is positioned at a first surface of the support substrate and includes a first bond site, and wherein the support substrate further includes a second surface facing opposite from the first surface, the second surface having a second conductive layer with a second bond site;
preventing the protective coating from covering the first bond site, or removing the protective coating from the first bond site; and
applying bond pad material to the first and second bond pad sites after applying the protective coating by removing a portion of the first conductive layer adjacent to the first bond site and applying an electrical potential to the second conductive layer and passing the electrical potential between the first and second conductive layers via a conductive path extending through the support substrate while the support substrate is exposed to the electrolyte.

28. The method of claim 27 wherein removing the protective coating includes removing the protective coating prior to making it at least generally permanent, and wherein the method further comprises making the coating at least generally permanent by applying energy to the protective coating prior to applying bond pad material to the first and second bond sites.

29. The method of claim 28 wherein applying an electrical potential includes applying an electrical potential directly to the second conductive layer without applying the electrical potential directly to the first conductive layer, other than through the conductive path.

30. A method for forming a support substrate for carrying microfeature dies, comprising:
patterning a first conductive layer on a first surface of a support substrate to form a bond site at the first surface, wherein the support substrate has a second surface facing opposite from the first surface, the second surface having a second conductive layer, and wherein the support substrate further includes a conductive path extending through the support substrate from the first conductive layer to the second conductive layer;

applying an at least generally permanent protective coating over the first conductive layer after patterning the first conductive layer by removing a portion of the first conductive layer adjacent to the first bond site;

preventing the protective coating from covering the bond site, or removing the protective coating from the bond site; and applying bond pad material to the bond site after applying the protective coating, wherein applying bond pad material includes:

exposing the support substrate to an electrolyte; and applying an electrical potential to the second conductive layer and passing an electrical current between the first and second conductive layers via the conductive path while the support substrate is exposed to an electrolyte, wherein the electrical potential is communicated to the first conductive layer via the conductive path, and wherein the electrical potential is not applied to the first conductive layer, other than through the conductive path.

31. The method of claim 30 wherein the bond site includes a first bond site, and wherein the method further comprises:

patterning the second conductive layer to form a second bond site, wherein the second bond site is electrically coupled to the first bond site via the conductive path; and applying conductive bond pad material to the second bond site.

32. A method for forming a support substrate for carrying microfeature dies, comprising:

patterning a first conductive layer on a first surface of a support substrate to form a first bond site at the first surface, wherein the support substrate has a second surface facing opposite from the first surface, the second surface having a second conductive layer, and wherein the support substrate further includes a conductive path extending through the support substrate from the first conductive layer to the second conductive layer;

applying an at least generally permanent protective coating over the first conductive layer after patterning the first conductive layer by removing a portion of the first conductive layer adjacent to the first bond site;

preventing the protective coating from covering the first bond site, or removing the protective coating from the first bond site; and applying bond pad material to the bond site after applying the protective coating, wherein applying bond pad material includes:

exposing the support substrate to an electrolyte; and applying an electrical potential to the second conductive layer and passing an electrical current between the first and second conductive layers via the conductive path while the support substrate is exposed to an electrolyte, wherein the electrical potential is communicated to the first conductive layer via the conductive path, and wherein the electrical potential is not applied to the first conductive layer, other than through the conductive path;

placing a removable protective coating over the second conductive layer;

preventing the removable protective coating from covering a second bond site at the second conductive layer, or removing the removable protective coating from the second bond site;

applying conductive bond pad material to the second bond site simultaneously with applying conductive bond pad material to the first bond site;

removing the removable protective coating from the second conductive layer; and patterning the second conductive layer by removing a portion of the second conductive layer while leaving the second bond site electrically coupled to the first bond site via the conductive path.

33. A method for forming a support substrate for carrying microfeature dies, comprising:

patterning a first conductive layer on a first surface of a support substrate to form a first bond site at the first surface, wherein the support substrate has a second surface facing opposite from the first surface, the second surface having a second conductive layer, and wherein the support substrate further includes a conductive path extending through the support substrate from the first conductive layer to the second conductive layer;

applying an at least generally permanent protective coating over the first conductive layer after patterning the first conductive layer by removing a portion of the first conductive layer adjacent to the first bond site;

preventing the protective coating from covering the first bond site, or removing the protective coating from the first bond site; and applying bond pad material to the first bond site after applying the protective coating, wherein applying bond pad material includes:

exposing the support substrate to an electrolyte; and applying an electrical potential to the second conductive layer and passing an electrical current between the first and second conductive layers via the conductive path while the support substrate is exposed to an electrolyte, wherein the electrical potential is communicated to the first conductive layer via the conductive path, and wherein the electrical potential is not applied to the first conductive layer, other than through the conductive path;

placing a removable protective dry film coating over the second conductive layer;

preventing the removable protective dry film coating from covering a second bond site at the second conductive layer, or removing the removable protective dry film coating from the second bond site;

applying conductive bond pad material to the second bond site simultaneously with applying conductive bond pad material to the first bond site;

removing the removable protective dry film coating from the second conductive layer; and patterning the second conductive layer by removing a portion of the second conductive layer while leaving the second bond site electrically coupled to the first bond site via the conductive path.

34. A method for forming a support substrate for carrying microfeature dies, comprising:

patterning a first conductive layer on a first surface of a support substrate to form a first bond site at the first surface, wherein the support substrate has a second surface facing opposite from the first surface, the second surface having a second conductive layer, and wherein the support substrate further includes a conductive path extending through the support substrate from the first conductive layer to the second conductive layer;

applying a first generally permanent protective coating over the first conductive layer after patterning the first conductive layer by removing a portion of the first conductive layer adjacent to the first bond site;

preventing the first generally permanent protective coating from covering the first bond site, or removing the first generally permanent protective coating from the first bond site; and applying bond pad material to the first bond site after applying the first generally permanent protective coating, wherein applying bond pad material includes:

exposing the support substrate to an electrolyte; and applying an electrical potential to the second conductive layer and passing an electrical current between the first and second conductive layers via the conductive path while the support substrate is exposed to an electrolyte, wherein the electrical potential is communicated to the first conductive layer via the conductive path, and wherein the electrical potential is not applied to the first conductive layer, other than through the conductive path;

placing a removable protective coating over the second conductive layer;

preventing the removable protective coating from covering a second bond site at the second conductive layer, or removing the removable protective coating from the second bond site;

applying conductive bond pad material to the second bond site simultaneously with applying conductive bond pad material to the first bond site;

removing the removable protective coating from the second conductive layer;

patterning the second conductive layer by removing a portion of the second conductive layer while leaving the second bond site electrically coupled to the first bond site via the conductive path;

applying a second at least generally permanent protective coating over the second conductive layer after patterning the second conductive layer; and preventing the second at least generally permanent protective coating from covering the second bond site, or removing the protective coating from the second bond site.

\* \* \* \* \*

UNITED STATES PATENT AND TRADEMARK OFFICE
CERTIFICATE OF CORRECTION

PATENT NO.       : 7,622,377 B2                              Page 1 of 1
APPLICATION NO.  : 11/218352
DATED            : November 24, 2009
INVENTOR(S)      : Teck Kheng Lee et al.

It is certified that error appears in the above-identified patent and that said Letters Patent is hereby corrected as shown below:

In column 12, line 19, in Claim 26, after "(e)" insert -- ; --.

Signed and Sealed this

Sixteenth Day of February, 2010

David J. Kappos
*Director of the United States Patent and Trademark Office*